(12) United States Patent
Yoon et al.

(10) Patent No.: US 11,680,990 B2
(45) Date of Patent: Jun. 20, 2023

(54) SYSTEM AND METHOD FOR ESTIMATING STATE OF HEALTH OF ALL-SOLID-STATE BATTERY

(71) Applicants: Hyundai Motor Company, Seoul (KR); Kia Corporation, Seoul (KR)

(72) Inventors: Yong Sub Yoon, Seoul (KR); Hajime Tsuchiya, Yokohama (JP); Yuki Sasaki, Yokohama (JP); Hironari Takase, Yokohama (JP)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 0 days.

(21) Appl. No.: 17/538,373

(22) Filed: Nov. 30, 2021

(65) Prior Publication Data

US 2023/0057912 A1 Feb. 23, 2023

(30) Foreign Application Priority Data

Jul. 27, 2021 (JP) .............................. JP2021-122525

(51) Int. Cl.
*G01R 31/392* (2019.01)
*H01M 10/0562* (2010.01)
*H01M 10/42* (2006.01)

(52) U.S. Cl.
CPC ...... *G01R 31/392* (2019.01); *H01M 10/0562* (2013.01); *H01M 10/425* (2013.01); *H01M 2010/4271* (2013.01)

(58) Field of Classification Search
None
See application file for complete search history.

(56) References Cited

U.S. PATENT DOCUMENTS

| | | | |
|---|---|---|---|
| 2004/0099047 A1* | 5/2004 | Raisanen | G01N 33/0029 73/25.05 |
| 2012/0015220 A1* | 1/2012 | Kawaoka | H01M 10/488 429/90 |
| 2012/0286793 A1* | 11/2012 | Kawaoka | H01M 10/0562 324/426 |
| 2016/0344068 A1* | 11/2016 | Kim | H01M 12/08 |
| 2017/0309968 A1* | 10/2017 | Komori | H01M 10/482 |

FOREIGN PATENT DOCUMENTS

| | | |
|---|---|---|
| JP | 2000260402 A | 9/2000 |
| JP | 3681440 B2 | 8/2005 |
| JP | 2006018053 A | 1/2006 |
| JP | 2006286962 A | 10/2006 |
| JP | 2006286963 A | 10/2006 |

(Continued)

*Primary Examiner* — Jas A Sanghera
(74) *Attorney, Agent, or Firm* — Fox Rothschild LLP

(57) ABSTRACT

A system and method of estimating the state of health of an all-solid-state battery are provided to detect the amount of hydrogen sulfide that is generated in all-solid-state battery cells and using the amount as a factor for estimating the state of health of the battery. The method of estimating a state of health (SOH) of an all-solid-state battery includes detecting whether hydrogen sulfide is generated in each cell of the all-solid-state battery, and estimating the state of health of the all-solid-state battery corresponding to an amount or an increase rate of generated hydrogen sulfide based on data prepared in advance.

11 Claims, 5 Drawing Sheets

(56) References Cited

FOREIGN PATENT DOCUMENTS

| | | |
|---|---|---|
| JP | 2006286964 A | 10/2006 |
| JP | 2006286965 A | 10/2006 |
| JP | 4692556 B2 | 6/2011 |
| JP | 5045849 B2 | 10/2012 |
| JP | 5533647 B2 | 6/2014 |
| JP | 6019104 B2 | 11/2016 |
| JP | 6180465 B2 | 8/2017 |
| KR | 101619634 B1 | 5/2016 |
| KR | 102180625 B1 | 11/2020 |

\* cited by examiner

SYSTEM AND METHOD FOR ESTIMATING STATE OF HEALTH OF ALL-SOLID-STATE BATTERY

CROSS-REFERENCE TO RELATED APPLICATION

This application claims under 35 U.S.C. § 119(a) the benefit of priority to Japanese Patent Application No. 2021-122525, filed on Jul. 27, 2021, the entire contents of which are incorporated herein by reference.

BACKGROUND

(a) Technical Field

The present invention relates to a system and method of estimating the state of health of an all-solid-state battery, and more particularly to a system and method of estimating the state of health of an all-solid-state battery involving detecting the amount of hydrogen sulfide that is generated in all-solid-state battery cells and using the amount as a factor for estimating the state of health of the battery.

(b) Background Art

Lithium-ion secondary batteries are widely applied to portable electronic devices such as smartphones and laptops, and many studies are being conducted on lithium-ion secondary batteries with the goal of implementation of the same as an essential component of eco-friendly electric vehicles.

The lithium-ion secondary batteries that are currently widely used use an electrolyte containing a flammable organic solvent. For this reason, serious safety problems may occur when various external shocks are applied to lithium ion secondary batteries, and an environment where cell control is impossible is created. Accordingly, an additional material for improving safety must be applied thereto or an additional safety device must be mounted thereon, separately from the basic structure of the battery cell.

Such a safety problem has brought about all-solid-state batteries. All-solid-state batteries use a solid-state electrolyte instead of a conventional electrolyte containing an organic solvent, thereby fundamentally solving the problem of low safety of the conventional battery. Candidates for solid electrolytes include sulfide-based solid electrolytes, oxide-based solid electrolytes, and organic solid electrolytes. Among them, sulfide-based solid electrolytes, having relatively high ionic conductivity, are attracting a great deal of attention.

All-solid-state batteries have several characteristics that distinguish them from conventional lithium-ion secondary batteries. First, all-solid-state batteries are fundamentally capable of securing safety due to the use of solid electrolytes. Accordingly, all-solid-state batteries are capable of increasing the energy density of the battery pack unit by obviating cell-sensing and safety devices used in conventional batteries. In addition, all-solid-state batteries are capable of overcoming limitations on the performance of conventional lithium ion secondary batteries using next-generation high-performance electrodes such as a lithium anode, a high-voltage cathode, and a sulfur cathode, which cannot be applied to conventional batteries. Finally, they are capable of realizing high-voltage cells using a bipolar electrode design in which a cathode and an anode are stacked in series based on the stability of the solid electrolyte, thereby exhibiting high energy density.

As described above, all-solid-state batteries realize a bipolar structure and obviate parts, such as a cell-balancing device based on the intrinsically stable voltage characteristics of solid electrolytes. However, when the casing of the battery is damaged due to the battery being insufficiently capable of withstanding long-use or moisture flows into the casing due to deterioration of the performance of a battery seal, there may be a problem in which hydrogen sulfide is generated in the sulfide-based solid electrolyte.

Therefore, it is necessary to develop a method of detecting the risk of generating hydrogen sulfide gas and simultaneously enabling estimation of the state of health (SOH) of the all-solid-state battery.

The above information disclosed in this Background section is only for enhancement of understanding of the background of the invention, and therefore it may contain information that does not form the prior art that is already known in this country to a person of ordinary skill in the art.

SUMMARY OF THE DISCLOSURE

The present invention has been made in an effort to solve the above-described problems associated with the prior art, and it is an object of the present invention to provide a system and method of estimating the state of health of an all-solid-state battery that are capable of estimating the state of health of the battery with improved reliability regardless of the state of charge of the battery, the temperature, and the like.

The objects of the present invention are not limited to that described above. Other objects of the present invention will be clearly understood by those with ordinary skill in the art to which the present invention pertains (hereinafter referred to as "those skilled in the art") from the following description.

In one aspect, the present invention provides a method of estimating a state of health (SOH) of an all-solid-state battery that may include detecting whether hydrogen sulfide is generated in each cell of the all-solid-state battery, and estimating the state of health of the all-solid-state battery corresponding to an amount or an increase rate of generated hydrogen sulfide based on data prepared in advance.

In another aspect, the present invention provides a system of estimating a state of health of an all-solid-state battery that may include the all-solid-state battery including a plurality of cells and a hydrogen sulfide sensor configured to measure an amount or an increase rate of generated hydrogen sulfide in each cell, and an all-solid-state battery management system configured to receive the amount or the increase rate of generated hydrogen sulfide measured in each cell and to estimate the state of health of the all-solid-state battery based on the received amount or increase rate of generated hydrogen sulfide.

Other aspects and preferred embodiments of the invention are discussed infra.

BRIEF DESCRIPTION OF THE DRAWINGS

The above and other features of the present invention will now be described in detail with reference to certain exemplary embodiments thereof, illustrated in the accompanying drawings which are given hereinbelow by way of illustration only, and thus are not limitative of the present invention, and wherein.

DETAILED DESCRIPTION

Figure 1:
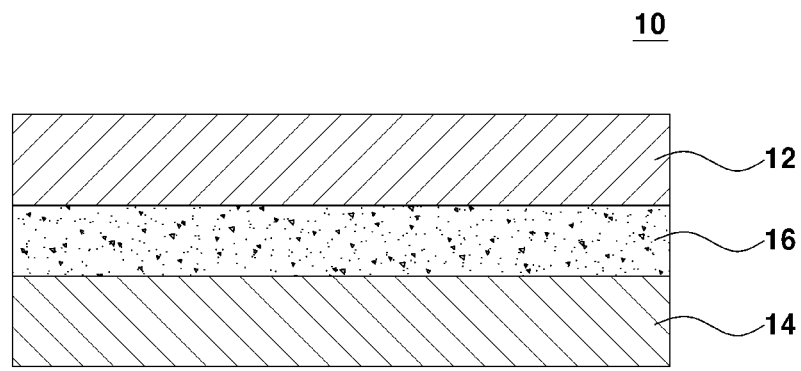
FIG. 1 is a schematic cross-sectional view illustrating an all-solid-state battery.

Hereinafter, preferred embodiments of the present disclosure will be described in detail with reference to the accompanying drawings. Specific structures or functions described in the embodiments of the present disclosure are merely for illustrative purposes. Embodiments according to the concept of the present disclosure may be implemented in various forms, and it should be understood that they should not be construed as being limited to the embodiments described in the present specification, but include all of modifications, equivalents, or substitutes included in the spirit and scope of the present disclosure.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between," "directly between," "adjacent to," or "directly adjacent to," should be construed in the same way.

Like reference numerals denote like components throughout the specification. In the meantime, the terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprise," "include," "have," etc., when used in this specification, specify the presence of stated components, steps, operations, and/or elements, but do not preclude the presence or addition of one or more other components, steps, operations, and/or elements thereof.

The state of health (SOH), which indicates the degree of deterioration of capacity of a battery, is a parameter that quantitatively represents change in the capacity of the battery, and indicates the extent to which the capacity of the battery has deteriorated. Therefore, the SOH enables replacement of the battery at an appropriate time and prevention of overcharge and overdischarge of the battery by adjusting the charge/discharge capacity of the battery depending on how long the battery has been in use. Therefore, it is important to establish a method for more accurately and reliably estimating the SOH of a battery.

Accordingly, the present invention provides a more reliable method of estimating the state of health of a battery through a combination of two estimation factors.

Hereinafter, the present invention will be described in detail with reference to the accompanying drawings.

As shown in FIG. 1, an all-solid-state battery cell 10 may include a cathode layer 12, an anode layer 14, and a solid electrolyte layer 16. An electrode laminate 20 is formed by sequentially laminating the cathode layer 12, the anode layer 14, and the solid electrolyte layer 16 at least once. The cathode layer 12 may include a cathode material, a sulfide-based solid electrolyte, a conductive material, a binder, and a solvent. The anode layer 14 may include an anode material, a sulfide-based solid electrolyte, a conductive material, a binder, and a solvent. The solid electrolyte layer 16 may include a sulfide-based solid electrolyte, a binder, and a solvent. The cathode layer 12 and the anode layer 14 are disposed on respective sides of the solid electrolyte layer 16. As the cathode layer, the anode layer, and the solid electrolyte layer may be formed of known materials, a detailed description thereof will be omitted.

Figure 2:
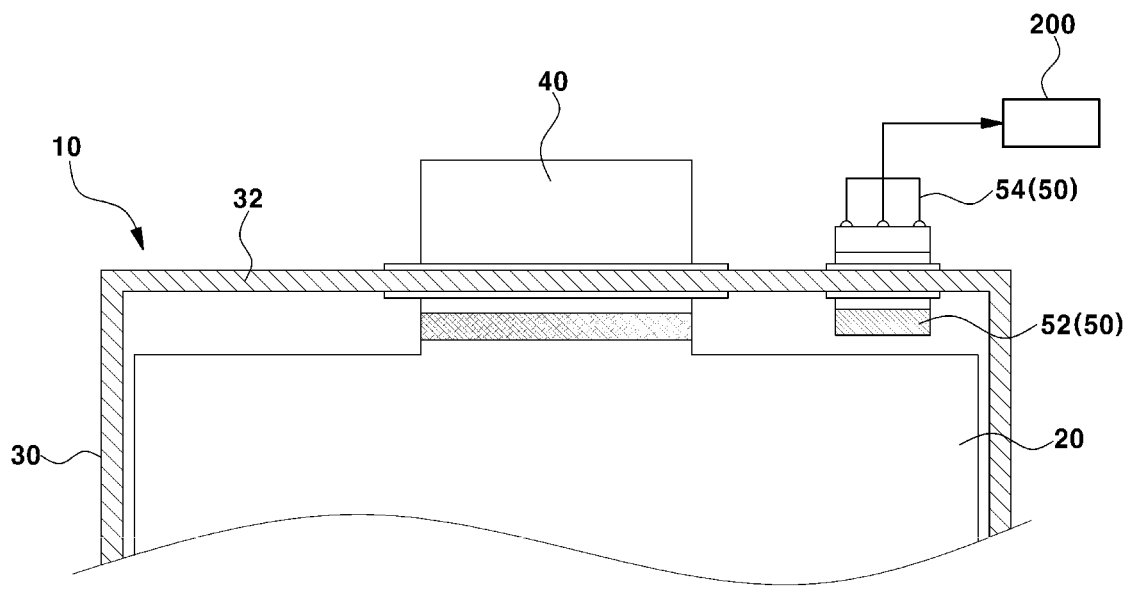
FIG. 2 is a cross-sectional view illustrating an all-solid-state battery cell according to the present invention.

As shown in FIG. 2, the electrode laminate 20 of the all-solid-state battery cell 10 is sealed in a casing 30. The electrode laminate 20 may be sealed by the casing 30 or a pouch, so the inside of the all-solid-state battery cell 10 can be protected from moisture. For this purpose, a sealing portion 32 may be provided on the perimeter of the casing 30. A lead tab 40 of the electrode protrudes through the casing 30 and provides a current conduction path to the outside of the battery. The gap between the lead tab 40 and the casing 30 may also be maintained sealed.

Figure 3:
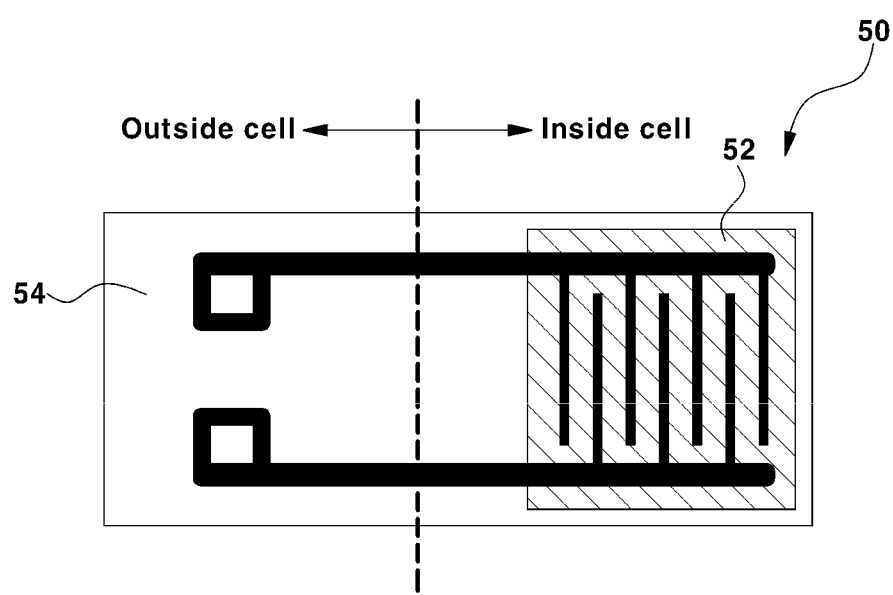
FIG. 3 illustrates a hydrogen sulfide sensor according to an embodiment of the present invention.

According to the present invention, the all-solid-state battery cell 10 may include a hydrogen sulfide sensor 50. As shown in FIG. 3, the hydrogen sulfide sensor 50 may be configured to detect hydrogen sulfide in the all-solid-state battery cell 10. The hydrogen sulfide sensor 50 may include a sensing unit 52 and a signaling unit 54. The sensing unit 52 may be configured to detect the amount of hydrogen sulfide generated in the all-solid-state battery cell 10, and the signaling unit 54 may be configured to transmit information regarding the detected amount of hydrogen sulfide to the outside in real time.

According to an embodiment of the present invention, a part of the hydrogen sulfide sensor 50 is disposed in the casing 30, and another part of the hydrogen sulfide sensor 50 protrudes outside the casing 30. The sensing unit 52 of the hydrogen sulfide sensor 50 may be disposed in the casing 30, while the signaling unit 54 of the hydrogen sulfide sensor 50 may be disposed outside the casing 30.

According to an embodiment of the present invention, the hydrogen sulfide sensor 50 is a thin film-type gas sensor. A known gas sensor may be used as the hydrogen sulfide sensor 50, and the sensing unit 52 may be a thin film containing zirconium (Zr), tin (Sn) or the like. When the hydrogen sulfide sensor 50 is disposed between the sealing portion 32 of the casing 30, it is beneficial to have a shape with a small thickness and high efficiency of use of space. Accordingly, the use of a thin film-type gas sensor is advantageous. However, in the present invention, the hydrogen sulfide sensor 50 is not limited to the thin film-type gas sensor, and other types of sensors may be used.

Figure 4:
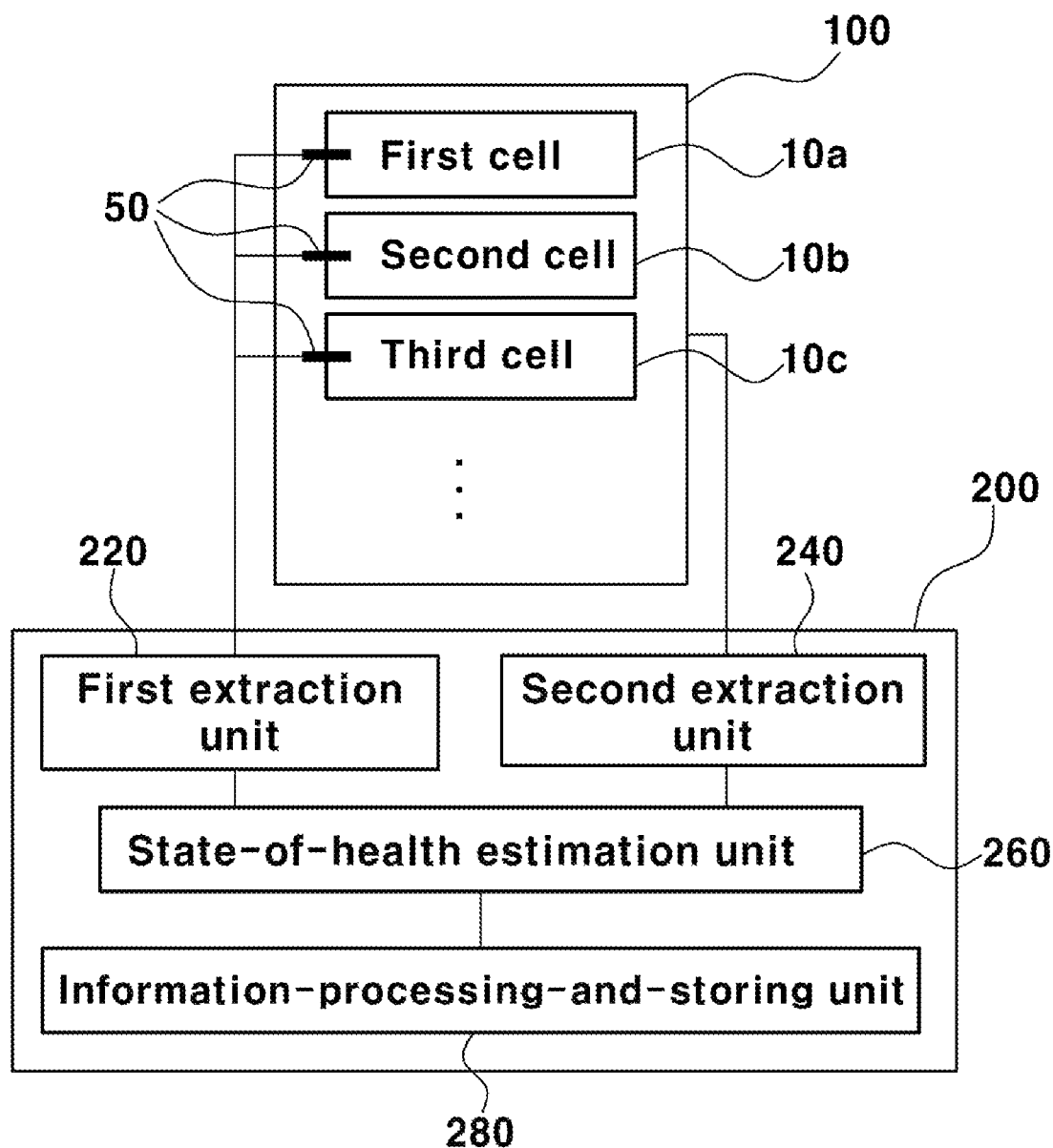
FIG. 4 is a block diagram illustrating the configuration of a system of estimating the state of health of the all-solid-state battery according to the present invention.

FIG. 4 is a block diagram illustrating the configuration of a system of estimating the state of health of an all-solid-state battery according to the present invention. The system of estimating the state of health of an all-solid-state battery may include an all-solid-state battery cell module 100 and an all-solid-state battery management system 200.

The all-solid-state battery cell module 100 may include a plurality of all-solid-state battery cells 10. Each all-solid-state battery cell 10 may include a hydrogen sulfide sensor 50. A total of three cells, namely a first cell 10a, a second cell 10b, and a third cell 10c, are shown in the drawing, but the number of cells may be increased or decreased depending on circumstances.

The amount of hydrogen sulfide in each cell 10 detected by the hydrogen sulfide sensor 50 may be transmitted in the form of an electrical signal to the outside. According to an embodiment of the present invention, the electrical signal detected by the hydrogen sulfide sensor 50 may be transmitted to the all-solid-state battery management system 200.

The hydrogen sulfide sensor 50 is an oxide-based porous membrane and may be configured to generate a current signal through a catalytic reaction, thus making it possible to measure the hydrogen sulfide concentration and change in the concentration. Incidentally, it is preferable for the amount of hydrogen sulfide that is generated, detected by the hydrogen sulfide sensor 50, to have an error of approximately 5% within the range of more than 0 to several tens of ppm (parts per million) in order to secure reliability of the initial degree of deterioration.

The all-solid-state battery management system 200 may be configured to acquire information regarding the state of the all-solid-state battery cell module 100 from the all-solid-state battery cell module 100, and to manage the state of charge (SoC), the state of health (SOH), or the like of the all-solid-state battery through modeling.

Figure 5A:
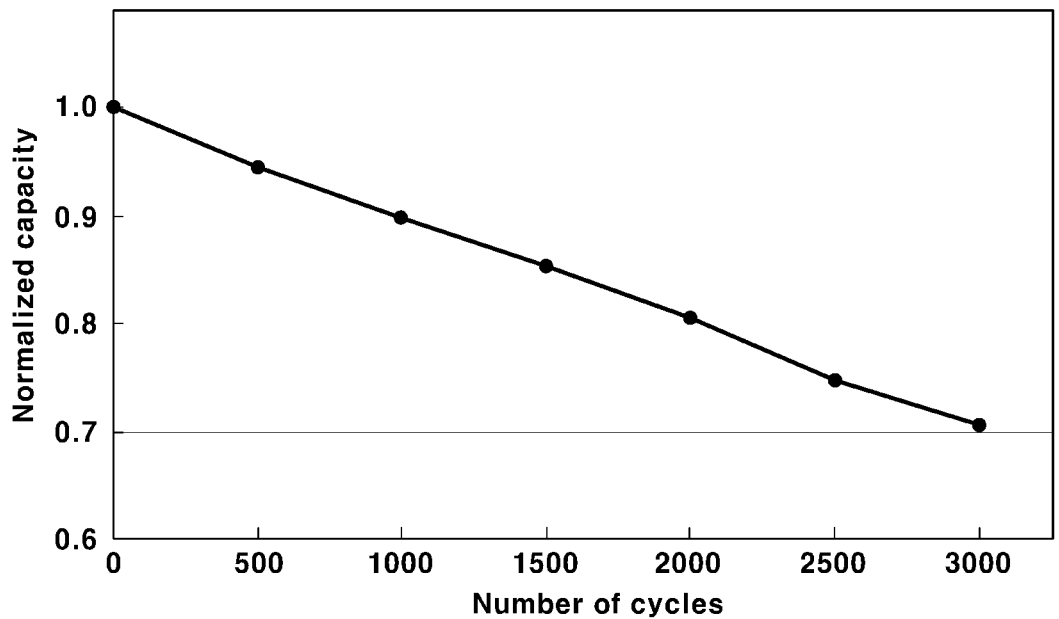
FIGS. 5A-5B illustrate determination of capacity deterioration as a function of charge/discharge durability of a lithium ion secondary battery.
Figure 5B:
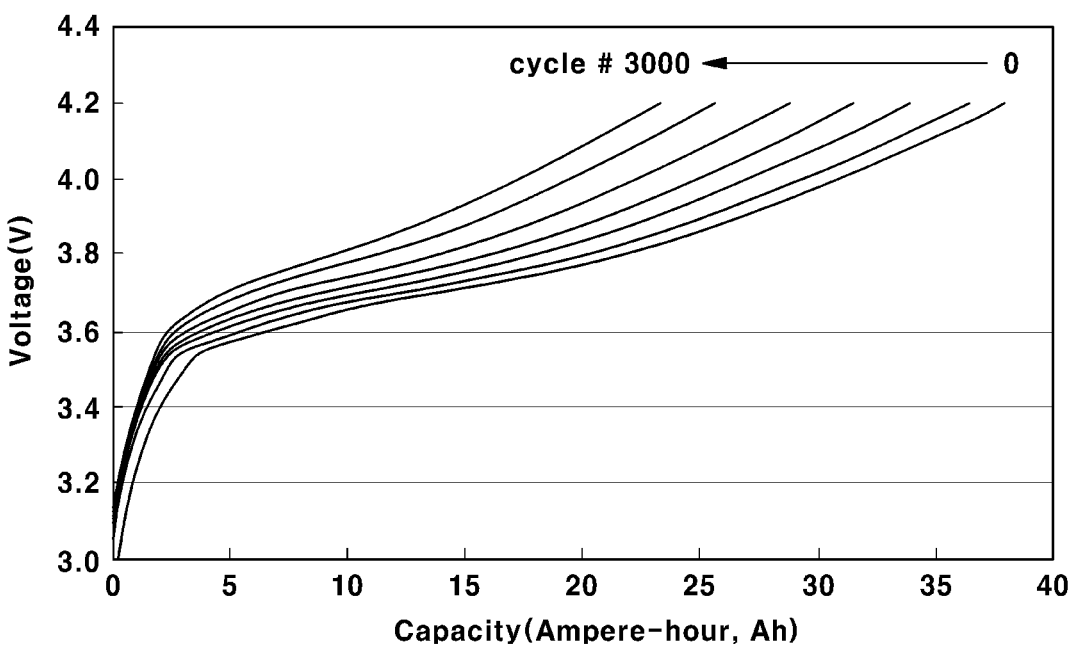

As shown in FIG. 5, generally, the capacity of the battery continuously decreases based on various capacity degradation mechanisms when the battery is repeatedly charged and discharged. As a non-limiting example, when the surface of the cathode material of the battery is deteriorated, the internal resistance of the cell increases and lithium is precipitated in the anode layer. As a result, the irreversible capacity may increase and the battery capacity may continuously decrease. Managing and predicting the rate of such capacity decrease is important in delivering reliable information to users and managing the battery system.

Accordingly, the all-solid-state battery management system 200 according to the present invention may be configured to monitor capacity information and current-voltage factors from the battery module or cell and process the information associated therewith. The all-solid-state battery management system 200 may be configured to minimize the size of errors in information by continuously updating information on the degree of cell deterioration while providing the user with the result of estimation of the battery performance based on the processed information.

According to the present invention, the all-solid-state battery management system 200 may include a first extraction unit 220, a second extraction unit 240, a state-of-health estimation unit 260, and an information-processing-and-storing unit 280.

The first extraction unit 220 may be configured to extract a factor for estimating the state of health of the all-solid-state battery. The first extraction unit 220 may be specifically configured to derive factors based on chemical reactions throughout the battery. Accordingly, the first extraction unit 220 may be configured to collect data on the amount of hydrogen sulfide generated in each cell 10 from each hydrogen sulfide sensor 50 provided in the all-solid-state battery cell 10. The first extraction unit 220 may be configured to extract the amount of hydrogen sulfide generated in real time measured by the hydrogen sulfide sensor 50 and to calculate the rate of increase in the amount of hydrogen sulfide based on the change in the amount of hydrogen sulfide that is generated over time. In addition, when the calculated amount of hydrogen sulfide that is generated exceeds a preset hydrogen sulfide threshold, the first extraction unit 220 may be configured to determine that the cell 10 is operating abnormally and stop operation of the cell.

As a non-limiting example, the first extraction unit 220 may be configured to extract a factor required for estimating the state of health of the battery from the amount of hydrogen sulfide detected by the hydrogen sulfide sensor 50 in the following manner. Since the content of the sulfide material differs depending on the specifications of individual battery cells, a relative value, not an absolute value, measured by the hydrogen sulfide sensor 50 is used as the amount of hydrogen sulfide that is generated, which is used to estimate the state of health of the battery. In other words, the amount of decomposed or released sulfur (S) element may be determined based on the amount (ppm) of hydrogen sulfide detected by the hydrogen sulfide sensor 50. The generated amount of hydrogen sulfide is expressed in percentage as the ratio of the amount of decomposed or released sulfur (S) to the total amount of sulfur (S) contained in the material constituting the cell. Therefore, by using the normalized amount of hydrogen sulfide that is generated, not the value actually detected by the hydrogen sulfide sensor 50, to estimate the state of health of the battery, the value extracted by the first extraction unit 220 may be used to estimate the state of health, regardless of the specifications of the cell.

According to the present invention, the capacity deterioration or state of health of the all-solid-state battery may be estimated based on the change in the amount of hydrogen sulfide detected in each cell 10. In other words, the state of health of the all-solid-state battery is evaluated by calculating the reactivity of the sulfide-based solid electrolyte. As a non-limiting example, when interfacial contact between the electrode and the electrolyte in the battery is deteriorated upon long-term use, the internal resistance of the battery increases and the structure of the solid electrolyte is deformed. For this reason, the generation of hydrogen sulfide increases, so deterioration of the battery may be detected. As another non-limiting example, when moisture is introduced into the all-solid-state battery from outside, the solid electrolyte reacts with the introduced moisture, thereby increasing the production of hydrogen sulfide. Therefore, according to the present invention, it is possible to predict deterioration in the capacity of the all-solid-state battery by detecting the generation of hydrogen sulfide in the cell. According to the present invention, it is possible to improve the reliability of the conventional method of estimating the state of health based on the phenomenon whereby hydrogen sulfide is generated when the solid electrolyte is deteriorated. In addition, the amount of hydrogen sulfide that is generated may be measured in real time regardless of the state of charge (SoC) of the cell 10, and abnormal phenomena, such as inflow of external moisture, can be detected.

The second extraction unit 240 may also be configured to extract factors for estimating the state of health of the all-solid-state battery, and in particular, to extract factors based on the electrochemical reaction. More specifically, the second extraction unit 240 may be configured to collect current-voltage data during charging of the battery and to collect full-charge capacity data of the all-solid-state battery.

The first extraction unit 220 and the second extraction unit 240 may be integrated with each other, but are preferably provided separately. According to some embodiments of the present invention, the information processing regarding the amount of hydrogen sulfide that is generated is configured to be performed by the first extraction unit 220, separately from the second extraction unit 240. This aims to impart to the first extraction unit 220, in addition to the function of estimating the state of health of the all-solid-state battery as in the second extraction unit 240, an additional function of performing hydrogen sulfide treatment or current interruption when an abnormal phenomenon occurs due to damage to the all-solid-state battery cell.

The state-of-health estimation unit 260 may be configured to estimate the state of health of the all-solid-state battery based on the data collected by the first extraction unit 220 and the second extraction unit 240.

With respect to the data extracted by the first extraction unit 220, the information-processing-and-storing unit 280 contains prestored data on the value of hydrogen sulfide generated for each battery state of health (SOH) (that is, from SOH of 100 to SOH of 0, there is no particular unit for the state of health (SOH), but it is assumed that the SOH of the cell at the initial stage of production is 100 whereas the SOH of the cell at a completely worn out stage is 0), obtained through experimentation in advance. As a non-limiting example, such prestored data may be a lookup table containing information on the amount of hydrogen sulfide generated at each SOH stage. The state-of-health estimation unit 260 may be configured to estimate the state of health of the cell 10 by comparing the amount of hydrogen sulfide that is generated, extracted by the first extraction unit 220, with the value shown in the lookup table.

The state-of-health estimation unit 260 may be configured to estimate the state of health through the discharge capacity factor based on the full-charge capacity data extracted from the second extraction unit 240. The discharge capacity factor may be extracted from the result of integrating the current of the cell 10 from full-charge (SoC of 100) to full-discharge (SoC of 0). A look-up table in which state-of-health values of the battery corresponding to the discharge capacity factors are stored may be obtained through experimentation in advance, and this data is stored in the information-processing-and-storing unit 280.

The state-of-health estimation unit 260 may be configured to estimate the state of health of the battery through the current-voltage data during charging, extracted from the second extraction unit 240. The second extraction unit 240 may be configured to extract the internal resistance of the cell 10 based on the current-voltage data during charging. Using Ohm's law, the internal resistance is calculated from a voltage change signal as a function of a certain current value. Estimation of the state of health of the battery is based on the fact that as aging of the cell 10 progresses, the internal resistance of the battery increases. In other words, the state-of-health estimation unit 260 contains a comparison reference for each cell specification. For the comparison reference, the capacity of the battery may be measured for each internal resistance of the battery at various temperatures. Next, a lookup table for SOH mapping is acquired by quantifying the measured capacity relative to the initial capacity of the battery. In addition, the state of health of the battery may be estimated by measuring the temperature and internal resistance of the battery in an actual use environment and then mapping the SOH corresponding to the internal resistance and temperature in the lookup table. According to the present invention, the reliability of the result of estimation of the state of health may be further improved by comparing the result of estimation performed by the first extraction unit 220 with the result of estimation performed by the second extraction unit 240.

The information-processing-and-storing unit 280 may be configured to store the result of estimation of state of health. In other words, the information-processing-and-storing unit 280 may be configured to store the collected information and update the stored information whenever there is a change in the collected information. In addition, as described above, the information-processing-and-storing unit 280 may be configured to store reference values (e.g., SOH values at respective generated amounts of hydrogen sulfide) determined through testing and evaluation in the form of a lookup table or the like. When the state-of-health estimation unit 260 determines the state of health, the information-processing-and-storing unit 280 may be configured to provide the comparison data, thereby enabling the state-of-health estimation unit 260 to estimate the state of health by comparing the values extracted by the first extraction unit 220 or the second extraction unit 240.

In addition, the information-processing-and-storing unit 280 may be configured to update and store the real-time state of health based on the values extracted by the first extraction unit 220 and the second extraction unit 240. When the state of health is estimated by the state-of-health estimation unit 260, the information-processing-and-storing unit 280 may be configured to update and store the estimated state-of-health in real time.

In addition, the information-processing-and-storing unit 280 may be configured to identify the cause of deterioration based on the estimated state of health, and store the identified cause of deterioration. In other words, according to the present invention, the cause of the deterioration may be identified, and the battery may be managed depending on the type of deterioration. Various causes for the generation of hydrogen sulfide in all-solid-state batteries may be expected. For example, such causes may include deterioration of the cathode layer, deterioration of the chemical reactivity of the material, and ingress of external moisture.

The deterioration of the cathode layer may be due to the durability to the electrochemical reaction. In particular, correction is required in consideration of the signals from both the first extraction unit 220 and the second extraction unit 240. In other words, the fact that the deterioration of the cathode layer affects the state of health of the battery can be confirmed by comparing the state of health obtained by the state-of-health estimation unit 260 based on the signal from the first extraction unit 220 with the state of health obtained by the state-of-health estimation unit 260 based on the signal from the second extraction unit 240.

The deterioration of the chemical reaction of the material is a factor related to material interface reaction, and occurs due to time or temperature, regardless of the electrochemical reaction. Accordingly, whether the material chemical reaction is deteriorated may be determined based on the state of health determined by the data of the first extraction unit 220. Since the deterioration of the material chemical reaction is less related to SOH estimation than in the case of cathode layer deterioration, in the step of storing by the information-processing-and-storing unit 280, it is necessary to isolate and manage the signal for the corresponding cell.

The inflow of external moisture is a pure chemical reaction that is unrelated to the electrochemical reaction. In such a case, it is necessary to estimate the state of health with the first extraction unit 220 alone.

According to the present invention, the information-processing-and-storing unit 280 may be configured to classify the type of deterioration based on the state of health estimated based on the data from the first extraction unit 220 and the state of health estimated based on the data from the second extraction unit 240 and store the state of health for each classified type of deterioration.

For example, if there is a difference between the state of health calculated by the data from the first extraction unit 220 and the state of health calculated by the data from the second extraction unit 240, whether the cause of deterioration is inflow of external moisture, deterioration of a material chemical reaction, or deterioration of the cathode layer may be identified through comparative analysis between the two values. Therefore, according to the present invention, it is possible to more accurately detect the cause of deterioration. Ultimately, according to the present invention, the battery may be managed in consideration of the type of deterioration.

Figure 6:
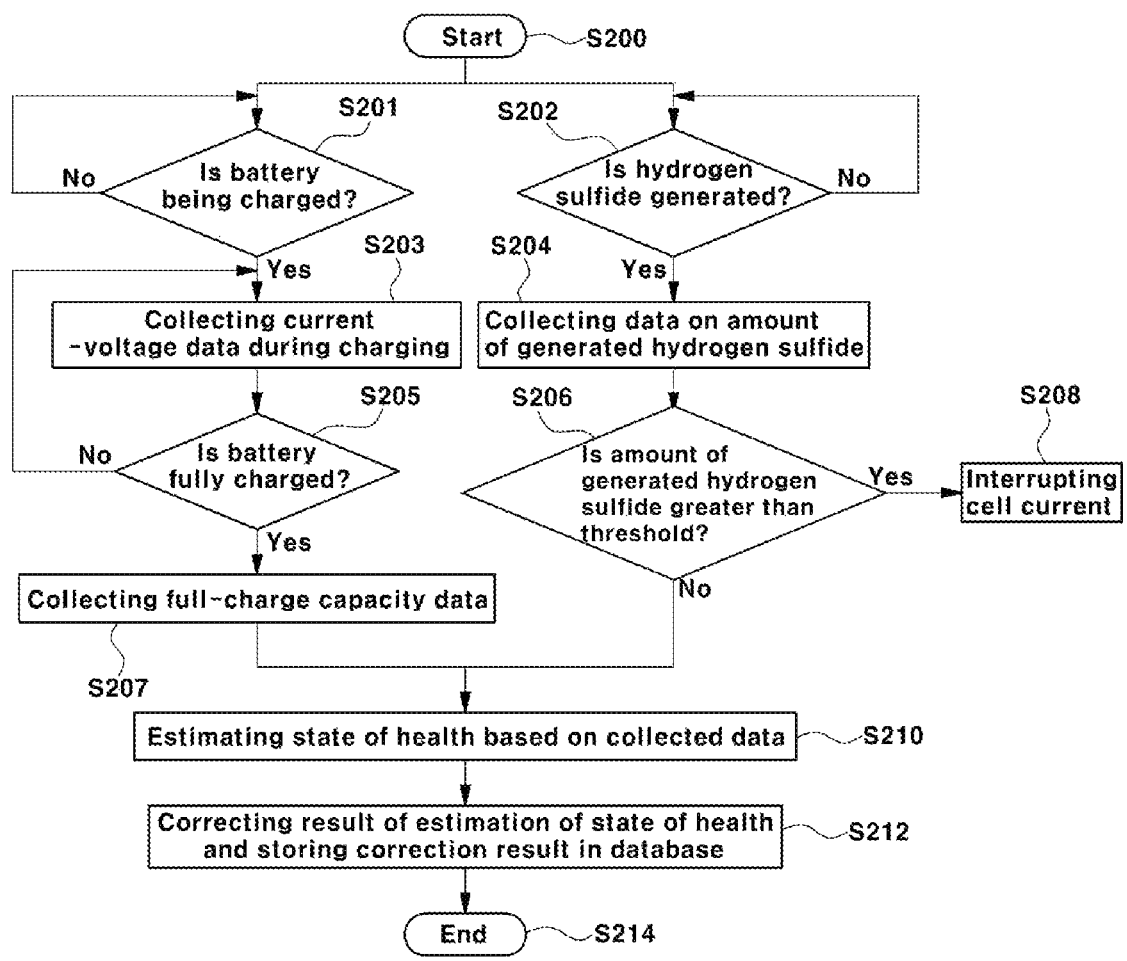
FIG. 6 is a flowchart illustrating a method of estimating the state of health of an all-solid-state battery according to the present invention.

As shown in FIG. 6, according to some embodiments of the present invention, a method of estimating the state of health of an all-solid-state battery is provided.

At step S200, estimation of the state of health of the all-solid-state battery according to the present invention commences. Steps S201, S203, S205 and S207 relate to the battery state-of-health estimation factors extracted by the second extraction unit 240, and steps S202, S204, S206 and S208 relate to factors extracted by the first extraction unit 220.

In step S201, whether the all-solid-state battery is being charged is determined. When the all-solid-state battery is being charged, the current-voltage data during charging is collected by the second extraction unit 240 (S203).

When the charging of the all-solid-state battery is completed (S205) after collection of the current-voltage data, data on the capacity of the all-solid-state battery when the all-solid-state battery is fully charged is collected by the second extraction unit 240 (S207).

In step S210, the state of health of the all-solid-state battery is estimated by the state-of-health estimation unit 260 based on the current-voltage data during charging, collected in step S203, and the full-charge capacity data, collected in step S207. As described above, the state of health (SOH) at an arbitrary point in time is estimated by comparing the discharge capacity factor calculated based on the full-charge capacity data and the internal resistance calculated based on the current-voltage data with the pre-arranged data.

In addition, after estimation of the state of health through collection of the current-voltage data during charging of the all-solid-state battery and the collection of full-charge capacity data, whether hydrogen sulfide is generated in the all-solid-state battery is detected by the first extraction unit 220 (S202). The generation of hydrogen sulfide may be detected by the hydrogen sulfide sensor 50 provided in each cell 10, and data on the amount of hydrogen sulfide that is generated, measured by the hydrogen sulfide sensor 50, is collected (S204).

The amount of hydrogen sulfide that is generated in real time may be continuously compared with a hydrogen sulfide threshold, which is a preset upper limit (S206). The hydrogen sulfide threshold is a preset value. When the amount of hydrogen sulfide that is generated exceeds the hydrogen sulfide threshold, it is determined that an abnormal phenomenon has occurred in the all-solid-state battery. The hydrogen sulfide threshold may vary depending on the capacity of the battery cell and the type of the solid electrolyte, but may be 1,000 ppm in a non-limiting example.

In response to determining that the current amount of hydrogen sulfide that has been generated exceeds the hydrogen sulfide threshold, the cell current of the all-solid-state battery may be interrupted (S208). According to the present invention, when the amount of hydrogen sulfide that is generated exceeds the hydrogen sulfide threshold, the safety of the battery pack may be secured by interrupting the battery current to thereby disable the battery.

When the amount of hydrogen sulfide that has been generated is less than the hydrogen sulfide threshold, the state-of-health of the all-solid-state battery may be estimated by the state-of-health estimation unit 260 based on the collected data on the generated amount of hydrogen sulfide (S210). As described above, the state of health is estimated by comparing the SOH value as a function of the amount of hydrogen sulfide generated in a certain cell with the value shown in a table prepared in advance.

The result of the state-of-health estimation of the all-solid-state battery obtained as described above may be stored and updated in the information-processing-and-storing unit 280, and the cause of deterioration can be identified by comparing the state of health determined based on the data of the first extraction unit 220 with the state of health determined based on the data of the second extraction unit 240. The deterioration factors identified through mutual correction between two data are stored in a database along with the corresponding state of health values.

Conventionally, it was only possible to estimate the state of health of the battery under specific conditions, such as the state of charge and temperature of the all-solid-state battery. However, according to the present invention, reliable estimation is possible regardless of such conditions. As a result, the system and method of estimating the state of health of the all-solid-state battery according to the present invention enables the accuracy of estimation of the state of health (SOH) of the battery cell to be improved using the characteristics of the all-solid-state battery.

According to the present invention, the reliability of the result of estimation of the state of health of the battery may be improved by further establishing the information on the chemical degradation mechanism factor in addition to the conventional electrochemical degradation mechanism by reflecting the characteristics of the all-solid-state battery. In other words, according to the present invention, the state of health of the battery cell may be estimated by collecting the current-voltage data during charging and the capacity data when fully charged, and at the same time, the reliability of the result of estimation of the state of health may be improved by collecting information on the amount of hydrogen sulfide, generated in real time, by the hydrogen sulfide sensor.

In addition, the estimation system according to the present invention may be additionally used as a safety device when an abnormal phenomenon such as damage to an all-solid-state battery cell occurs.

As is apparent from the foregoing, the present invention provides a system and method of estimating the state of health of an all-solid-state battery capable of estimating the state of health of the battery with improved reliability, regardless of the state of charge and temperature of the battery.

The effects of the present invention are not limited to those mentioned above. It should be understood that the effects of the present invention include all effects that can be inferred from the description of the present invention.

The present invention has been described in detail with reference to preferred embodiments. However, it will be appreciated by those skilled in the art that changes may be made in these examples without departing from the principles and spirit of the present invention, the scope of which is defined in the appended claims and their equivalents.

What is claimed is:

1. A method of estimating a state of health (SOH) of an all-solid-state battery, comprising:
    detecting whether hydrogen sulfide is generated in each cell of the all-solid-state battery; estimating the state of health of the all-solid-state battery corresponding to an amount or an increase rate of generated hydrogen sulfide based on data prepared in advance;
    collecting current-voltage data when the all-solid-state battery is being charged, and collecting capacity data when the all-solid-state battery is fully charged;
    estimating the state of health of the all-solid-state battery by comparing the current-voltage data and the capacity data when the all-solid-state battery is fully charged with data sets prepared in advance; and
    identifying a plurality of deterioration factors of the battery by comparing a first state of health estimated based on the amount of generated hydrogen sulfide with a second state of health estimated based on the current-voltage data and the capacity data when the all-solid-state battery is fully charged.

2. The method according to claim 1, further comprising: interrupting a current in any cell of the all-solid-state battery in response to determining that the amount or the increase rate of generated hydrogen sulfide detected in the cell exceeds a preset hydrogen sulfide threshold.

3. The method according to claim 1, further comprising: storing the first state of health, the second state of health, and the identified deterioration factors in a database.

4. The method according to claim 1, further comprising: managing the state of health for each identified deterioration factor.

5. A system of estimating a state of health of an all-solid-state battery, the system comprising:
    the all-solid-state battery including a plurality of cells and a hydrogen sulfide sensor configured to measure an amount or an increase rate of generated hydrogen sulfide in each cell; and
    an all-solid-state battery management system configured to receive the amount or the increase rate of generated hydrogen sulfide measured in each cell and to estimate the state of health of the all-solid-state battery based on the received amount or increase rate of generated hydrogen sulfide;
    wherein the all-solid-state battery management system is configured to estimate the state of health of the all-solid-state battery based on the current-voltage data during charging and the capacity data when fully charged; and
    wherein the all-solid-state battery management system includes:
        a first extraction unit configured to extract the amount or the increase rate of generated hydrogen sulfide as a first factor to determine the state of health of the battery from the hydrogen sulfide sensor; and
        a second extraction unit configured to extract the current-voltage data during charging and capacity data when fully charged as a second factor to determine the state of health of the battery.

6. The system according to claim 5, wherein the all-solid-state battery management system further comprises a state-of-health estimation unit,
    wherein the state-of-health estimation unit is configured to estimate a first state of health corresponding to the first factor using a first data set prepared in advance and to estimate a second state of health corresponding to the second factor using a second data set prepared in advance.

7. The system according to claim 6, wherein the all-solid-state battery management system further includes an information-processing-and-storing unit, and wherein the information-processing-and-storing unit is configured to store the first data set and the second data set, and to update and store the estimated first and second states of health in real time.

8. The system according to claim 7, wherein the information-processing-and-storing unit is configured to identify a plurality of deterioration factors by comparing the first state of health with the second state of health and to store the identified deterioration factors.

9. The system according to claim 8, wherein the all-solid-state battery management system is configured to manage the state of health for each identified deterioration factor.

10. The system according to claim 5, wherein each cell is sealed by a casing, and wherein a first part of the hydrogen sulfide sensor is disposed inside the casing, and a second part of the hydrogen sulfide sensor is disposed outside the casing.

11. The system according to claim 5, wherein the hydrogen sulfide sensor is a thin-film gas sensor.

* * * * *